(12) United States Patent
Funahashi

(10) Patent No.: US 10,672,697 B2
(45) Date of Patent: Jun. 2, 2020

(54) WIRING BOARD AND ELECTRONIC PACKAGE

(71) Applicant: KYOCERA Corporation, Kyoto-shi, Kyoto (JP)

(72) Inventor: Akihiko Funahashi, Kagoshima (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/747,361

(22) PCT Filed: Jul. 13, 2016

(86) PCT No.: PCT/JP2016/070629
§ 371 (c)(1),
(2) Date: Jan. 24, 2018

(87) PCT Pub. No.: WO2017/018212
PCT Pub. Date: Feb. 2, 2017

(65) Prior Publication Data
US 2018/0218974 A1      Aug. 2, 2018

(30) Foreign Application Priority Data

Jul. 28, 2015   (JP) ................................ 2015-148744

(51) Int. Cl.
*H01L 23/495* (2006.01)
*H01L 23/498* (2006.01)
(Continued)

(52) U.S. Cl.
CPC .... *H01L 23/49838* (2013.01); *H01L 21/4857* (2013.01); *H01L 21/4867* (2013.01);
(Continued)

(58) Field of Classification Search
CPC ......... H01L 23/49838; H01L 23/49822; H01L 23/12; H01L 23/13; H01L 21/4846; H01L 21/4857; H01L 2224/83385
(Continued)

(56) References Cited

U.S. PATENT DOCUMENTS

2006/0289972 A1\* 12/2006 Nishimura ............ H01L 21/563
257/666
2014/0057080 A1\* 2/2014 Iwakoshi .......... H01L 23/49811
428/157

FOREIGN PATENT DOCUMENTS

JP         09-312471 A      12/1997
JP         2002-299495 A    10/2002
(Continued)

OTHER PUBLICATIONS

International Search Report, PCT/JP2016/070629, dated Oct. 11, 2016, 2 pgs.

*Primary Examiner* — Tan N Tran
(74) *Attorney, Agent, or Firm* — Volpe and Koenig, P.C.

(57) ABSTRACT

A wiring board and an electronic package maintain the flatness of the surface of the wiring board. The wiring board includes a flat insulating layer having a flat upper surface, and a conductive layer on the upper surface of the insulating layer with a space left from an outer edge of the insulating layer. The conductive layer includes a peripheral portion, a central portion inward from the peripheral portion, and a linear portion included in the central portion. The peripheral portion is raised along the outer edge of the insulating layer. The linear portion is raised to a height position of the peripheral portion.

8 Claims, 11 Drawing Sheets

(51) Int. Cl.
  *H01L 27/14* (2006.01)
  *H05K 1/11* (2006.01)
  *H05K 1/02* (2006.01)
  *H01L 21/48* (2006.01)
  *H01L 23/00* (2006.01)
  *H01L 33/62* (2010.01)
  *H05K 3/46* (2006.01)
  *H05K 3/12* (2006.01)
  *H05K 1/18* (2006.01)
  *H01L 23/15* (2006.01)
  *H01L 23/13* (2006.01)

(52) U.S. Cl.
  CPC .............. *H01L 24/48* (2013.01); *H01L 27/14* (2013.01); *H05K 1/0271* (2013.01); *H05K 1/11* (2013.01); *H01L 23/13* (2013.01); *H01L 23/15* (2013.01); *H01L 23/49822* (2013.01); *H01L 24/45* (2013.01); *H01L 33/62* (2013.01); *H01L 2224/45144* (2013.01); *H01L 2224/48091* (2013.01); *H01L 2224/48227* (2013.01); *H01L 2224/83385* (2013.01); *H01L 2924/12041* (2013.01); *H01L 2924/14* (2013.01); *H01L 2924/146* (2013.01); *H05K 1/183* (2013.01); *H05K 3/1216* (2013.01); *H05K 3/4629* (2013.01); *H05K 3/4697* (2013.01); *H05K 2201/09736* (2013.01); *H05K 2203/049* (2013.01)

(58) Field of Classification Search
  USPC ........................................................ 257/668
  See application file for complete search history.

(56) References Cited

FOREIGN PATENT DOCUMENTS

| JP | 2002-373956 A | 12/2002 |
| JP | 2006-186232 A | 7/2006 |

* cited by examiner

WIRING BOARD AND ELECTRONIC PACKAGE

FIELD

The present invention relates to a wiring board on which an electronic device, an imaging device such as a charge coupled device (CCD) or a complementary metal oxide semiconductor (CMOS) device, a light-emitting device such as a light emitting diode (LED), or an integrated circuit is mounted, and to an electronic package.

BACKGROUND

As described in Japanese Unexamined Patent Application Publication No. 9-312471, a known wiring board includes a flat insulating layer having a flat upper surface, and a conductive layer with a large surface area on the upper surface of the insulating layer. Also, a known electronic package includes an electronic device mounted on the upper surface of such a wiring board. A conductive layer is formed on the wiring board by screen printing. The conductive layer formed by screen printing is likely to have raised two ends in a cross-sectional view.

A demand is typically increasing for thinner and multilayered wiring boards. A conductive layer with peripheral portions raised higher than its central portion in a cross-sectional view can cause the upper surface of the wiring board to deform, on which an electronic device is not easily mountable. The mountability is to be improved.

BRIEF SUMMARY

A wiring board according to one aspect of the present invention includes a flat insulating layer having a flat upper surface, and a conductive layer on the upper surface of the insulating layer with a space left from an outer edge of the insulating layer. The conductive layer includes a peripheral portion, a central portion inward from the peripheral portion, and a linear portion included in the central portion. The peripheral portion is raised along the outer edge of the insulating layer. The linear portion is raised to a height position of the peripheral portion.

An electronic package according to another aspect of the present invention includes the above wiring board and an electronic device mounted on the wiring board.

DETAILED DESCRIPTION

Embodiments of the present invention will now be described by way of example with reference to the drawings. In the embodiments described below, an electronic package refers to a structure including an electronic device mounted on a wiring board. Although the wiring board and the electronic package may be oriented in any directions, the wiring board and the electronic package are each defined herein for ease of explanation to have an upper surface and a lower surface in the orthogonal xyz coordinate system having the positive z-direction upward.

First Embodiment

Figure 5A:
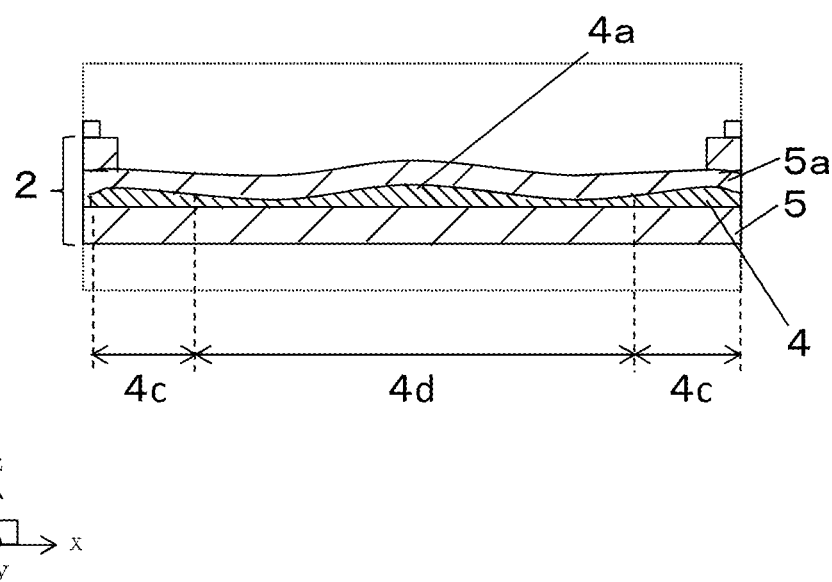
FIG. 5A is an enlarged view of a main part B of the wiring board according to the embodiment shown in FIG. 1B.
Figure 5B:
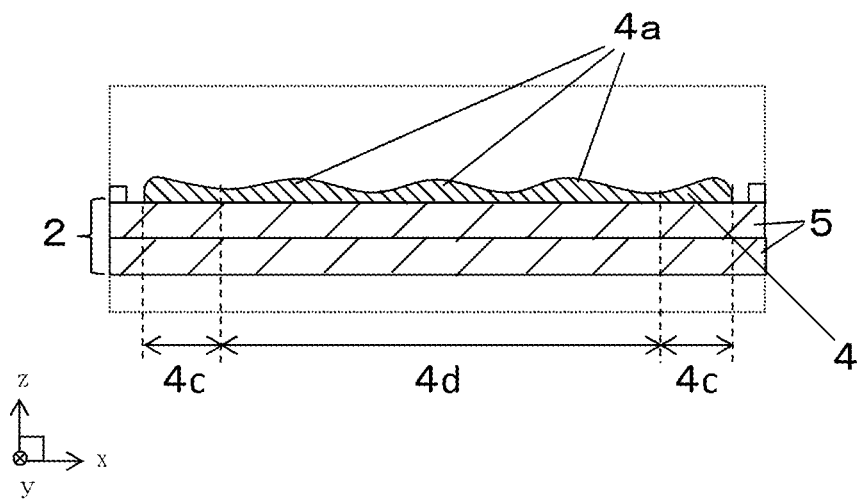
FIG. 5B is an enlarged view of a main part B of the wiring board according to the embodiment shown in FIG. 3B.

An electronic package 21 and a wiring board 1 according to a first embodiment of the present invention will now be described with reference to FIGS. 1A to 5B and FIGS. 11A to 12B. The electronic package 21 according to the present embodiment includes the wiring board 1, an electronic device 10, and a lid. The lid is not shown in FIGS. 2A and 2B and FIGS. 4A and 4B. FIGS. 1A to 4B are examples of top views or cross-sectional views of the structure according to the present embodiment. FIGS. 5A and 5B are enlarged views of a main part B in the present embodiment shown in FIGS. 1A and 1B and FIGS. 3A and 3B. FIGS. 11A to 12B are diagrams describing examples of a method for manufacturing a wiring board according to the present embodiment. In FIGS. 1A to 5B, a dotted line indicates an inner layer, and a dotted hatched area indicates a ridge of the conductive layer 4 (a raised portion in a cross-sectional view).

In the examples shown in FIGS. 1A to 5B, the wiring board 1 according to the present embodiment includes at least one flat insulating layer 5 having a flat upper surface, and a conductive layer 4 formed on the upper surface of the insulating layer with a space left from an outer edge of the insulating layer 5. The conductive layer 4 includes a peripheral portion 4c, which is raised along the outer edge of the insulating layer 5, a central portion 4d inward from the peripheral portion 4c, and a linear portion 4a included in the central portion 4d that is raised to a height position of the peripheral portion 4c.

The wiring board 1 includes the flat insulating layer 5 having the flat upper surface, and the conductive layer 4 formed on the upper surface of the insulating layer with a space left from an outer edge of the insulating layer 5. The insulating layer 5 may be formed from, for example, an electrical insulating ceramic material. Examples of the electrical insulating ceramic material include sintered aluminum oxide, sintered mullite, sintered silicon carbide, sintered aluminum nitride, sintered silicon nitride, and sintered glass ceramic. The insulating layer 5 formed from an electrical insulating ceramic material is a relatively soft ceramic green sheet during manufacture, which then undergoes firing and other processes during manufacture to be the insulating layer 5 included in the wiring board 1.

The insulating layer 5 may be formed from, for example, a resin. Examples of the resin include an epoxy resin, a polyimide resin, an acryl resin, a phenolic resin, and a fluorine-based resin. Examples of the fluorine-based resin include a polyester resin and a polytetrafluoroethylene resin.

In the examples shown in FIGS. 1A to 4B, the wiring board 1 includes a plurality of insulating layers 5 formed from the above material that are stacked on one another. In some embodiments, the wiring board 1 may include a single insulating layer 5. When the wiring board 1 includes a plurality of insulating layers 5, the insulating layers 5 are stacked on one another or bonded to one another to form a substrate 2.

The wiring board 1 may include five insulating layers 5 as shown in the examples of FIGS. 1A to 2B, or may include two insulating layers 5 as shown in the examples of FIGS. 3A to 4B. In some embodiments, the wiring board 1 may include three or four, or six or more insulating layers 5. The wiring board 1 may have a rectangular profile as viewed from above, with a length of 3 to 100 mm on one side, and a height of 0.2 to 20 mm. The opening may have a length of 2 to 90 mm on one side as viewed from above.

As in the examples of FIGS. 1A to 4B, the wiring board 1 includes, on its upper surface, pads 3 to be electrically connected to the electronic device 10. In the examples shown in FIGS. 1A to 2B, the substrate 2 has a recess that is defined by a frame 2b formed from a plurality of insulating layers 5 with a through-hole and a base 2a formed from a plurality of insulating layers 5 with no through-hole. In the examples shown in FIGS. 1A to 2B, the frame 2b includes two frames with different sizes. The two frames 2b define a step, on which the pads 3 are placed. The wiring board 1 may have electrodes for connection to external circuits.

In the examples shown in FIGS. 1A to 4B, the conductive layer 4 is formed on the upper surface of the insulating layers 5 in the substrate 2 with a space left from an outer edge of the insulating layers 5. The space left between the outer edge of the insulating layers 5 and the outer edge of the conductive layer 4 reduces exposure of the conductive layer 4 at the outer edge of the wiring board 1, and reduces, for example, unintended electrical conduction. The conductive layer 4 is spaced from the outer edge of the wiring board 1 by at least 20 µm to further reduce exposure of the conductive layer 4 at the outer edge of the wiring board 1.

The wiring board 1 may internally contain inner wiring conductors including feedthrough conductors for electrical conduction between the insulating layers 5, and inner wiring. The wiring board 1 may have outer wiring conductors exposed on its outer surface. The inner wiring conductors placed on each of the insulating layers 5 included in the wiring board 1 may be electrically connected to the outer wiring conductors exposed on the outer surface of each of the insulating layers 5. The conductive layer 4 may be electrically connected to another conductive layer 4, the pads 3, the electrodes, or the inner conductors. The outer wiring conductors herein refer to wiring conductors exposed outside the wiring board 1 excluding the pads 3 and the electrodes.

When the wiring board 1 is formed from an electrical insulating ceramic material, the pads 3, the conductive layer 4, and the electrodes may be formed from tungsten (W), molybdenum (Mo), manganese (Mn), silver (Ag), or copper (Cu), or an alloy containing one or more of these metals.

The exposed surfaces of the pads 3, the conductive layer 4 placed on the surface of the wiring board 1, the electrodes, and the outer wiring conductor may be plated. The plating layer protects the exposed surfaces of the pads 3, the conductive layer 4 on the surface of the wiring board 1, the electrodes, and the outer wiring conductor, and increases their resistance to oxidation. The plating layer also improves the electrical connection between the pads 3 and the electronic device 10 with interconnections 13 (e.g., bonding wires). The plating layer may be, for example, a Ni plating layer with a thickness of 0.5 to 10 µm, or this Ni plating layer may be further coated with a gold (Au) plating layer with a thickness of 0.5 to 3 µm.

The conductive layer 4 in the wiring board 1 includes the peripheral portion 4c raised along the outer edge of the insulating layer 5, and the central portion 4d inward from the peripheral portion 4c. When the insulating layer 5 may be formed from, for example, an electrical insulating ceramic material, screen printing is known to be used for forming the conductive layer 4 on a ceramic green sheet that is to be the insulating layer 5. In screen printing, a semiliquid electrical conductor that is to be the conductive layer 4 is placed on a mesh mask, which is pressed with, for example, a squeegee to form the conductive layer 4. The outer periphery of the mask is fixed with, for example, a stainless steel plate. Under stress applied by the squeegee, the mask bends differently between its outer periphery and its central portion. This causes the conductive layer 4 to have the peripheral portion 4c, which is raised along the outer edge of the insulating layer 5 in a cross-sectional view, and the central portion 4d inward from the peripheral portion 4c.

The insulating layer 5 may be formed from, for example, a resin. When the conductive layer 4 is formed on the upper surface of the resin insulating layer 5 by screen printing, the conductive layer 4 in the wiring board 1 also includes the peripheral portion 4c, which is raised along the outer edge of the insulating layer 5 in a cross-sectional view, and the central portion 4d inward from the peripheral portion 4c, in the same manner as when the insulating layer 5 is formed from an electrical insulating ceramic material.

The conductive layer 4 in the wiring board 1 includes the linear portion 4a included in the central portion 4d that is raised to the height position of the peripheral portion 4c. The area defined by the peripheral portion 4c and the linear portion 4a is hereafter referred to as the recess.

Typically, the wiring board 1 is to be thinner and multilayered. In response to this, the insulating layer 5 included in the substrate 2 in the wiring board 1 is also thinner than before. The insulating layer 5 is formed from, for example, an electrical insulating ceramic material. When the conductive layer 4 having its periphery portion raised higher than its central portion in a cross-sectional view is covered by a relatively soft ceramic green sheet to be the insulating layer 5 and this structure is pressed, the ceramic green sheet to be the insulating layer 5 can partially deform to have a recess, which can then create a recess on the upper surface of the wiring board 1. The recess on the insulating layer 5 degrades the mountability of the electronic device 10 on the insulating layer 5. The mountability is to be improved. In the examples shown in the FIGS. 1A to 2B according to the present embodiment, the wiring board 1 includes the conductive layer 4 having the linear portion 4a raised to the height position of the peripheral portion 4c in its central portion 4d, and further includes a second insulating layer 5a covering the upper surface of the conductive layer 4. This structure reduces the area of the recess on the upper surface of the conductive layer 4. When the structure including a ceramic green sheet to be the second insulating layer 5a placed on the conductive layer 4 is pressed, the second insulating layer 5a deforms in conformance to the shape of the conductive layer 4. This prevents a large recess from forming on the upper surface of the wiring board 1, and improves the mountability of the electronic device 10.

The insulating layer 5 may also be formed from, for example, a resin. The resin insulating layer 5 is also usable in the same manner as the insulating layer 5 formed from an electrically insulating ceramic material. In particular, a wiring board 1 including a resin insulating layer 5, such as a flexible wiring board, can have a thinner insulating layer 5 on the upper surface of the conductive layer 4. This wiring board 1 can also have the structure according to the present embodiment to prevent a recess from forming on the upper surface of the wiring board 1, and improve the mountability of the electronic device 10.

Additionally, the electronic device 10 typically tends to have more functions. Thus, the electronic device 10 can generate more heat during operation. To dissipate heat from the electronic device 10 more efficiently, the conductive layer 4 may be formed on the surface of the wiring board 1 to overlap the electronic device 10 as viewed from above. When the outer edge of the conductive layer 4 is raised higher than the central portion in a cross-sectional view as in the structure known in the art, the shape of the conductive layer 4 can prevent the electronic device 10 from being easily mounted in the mounting process, and can degrade the mountability of the electronic device 10. In response to this, in the examples shown in FIGS. 3A to 4B of the present embodiment, the conductive layer 4 in the wiring board 1 includes the linear portions 4a in the central portion 4d that is raised to the height position of the peripheral portion 4c, and the conductive layer 4 is placed on the surface of the wiring board 1. This structure may reduce the area of a recess on the upper surface of the conductive layer 4. This improves the mountability of the electronic device 10 in the process for mounting the electronic device 10. Additionally, the conductive layer 4 and the electronic device 10 in contact with each other allow heat from the electronic device 10 to be more efficiently dissipated toward the wiring board 1. The conductive layer 4 in contact with a heat-generating part of the electronic device 10, such as a computation unit, allows more heat to be dissipated. As in the examples of FIGS. 3A to 4B, the conductive layer 4 on the upper surface of the wiring board 1 produces a difference in color between the insulating layer 5 and the conductive layer 4. This color difference can be used as an alignment mark for determining the area in which the electronic device 10 is to be mounted.

The conductive layer 4 including the linear portions 4a that are raised to the substantially same height as the peripheral portion 4c as in the embodiments of the present invention can lower the resistance at the linear portions 4a. This lowers the resistance of the conductive layer 4 connected to, for example, a power supply or the ground. The structure according to the present embodiment thus improves the electrical characteristics while preventing the wiring board 1 from deforming to have a recess.

The electronic device 10 has its periphery located in the recesses defined by the linear portions 4a included in the central portion 4d of the conductive layer 4. This design prevents the outer edges of the electronic device 10 from coming in contact with the wiring board 1. This may prevent the electronic device 10 from chipping.

The height of the peripheral portion 4c in the conductive layer 4 according to the present embodiment is, for example, about 3 to 25 μm from the upper surface of the insulating layer 5. The height of the linear portion 4a is, for example, about 3 to 20 μm from the upper surface of the central portion 4d. Although the linear portion 4a may protrude to substantially the same position as the peripheral portion 4c, a slight difference is allowable between the height of the linear portion 4a and the height of the peripheral portion 4c due to process errors. The height difference between the peripheral portion 4c and the linear portion 4a may be 5 μm or less to produce the effects of the present embodiment.

In the examples shown in FIGS. 1A to 2B, the substrate 2 including a plurality of insulating layers 5 includes the frame 2b, and the peripheral portion 4c or the linear portion 4a overlapping the opening of the frame 2b as viewed from above. During manufacture, the frame 2b in the wiring board 1 typically tends to bend toward the base 2a. This may degrade the reliability of bonding with the electronic device 10. In response to this, as in the examples of FIGS. 1A to 2B, the peripheral portion 4c or the linear portion 4a overlaps the opening of the frame 2b as viewed from above. The peripheral portion 4c or the linear portion 4a serves as a support to prevent the frame 2b from bending toward the base 2a. The upper surface of the frame 2b thus has intended flatness to allow the pads 3 on the upper surface of the frame 2b to also have intended flatness. This structure improves the reliability of bonding between the electronic device 10 and the wiring board 1.

Figure 1A:
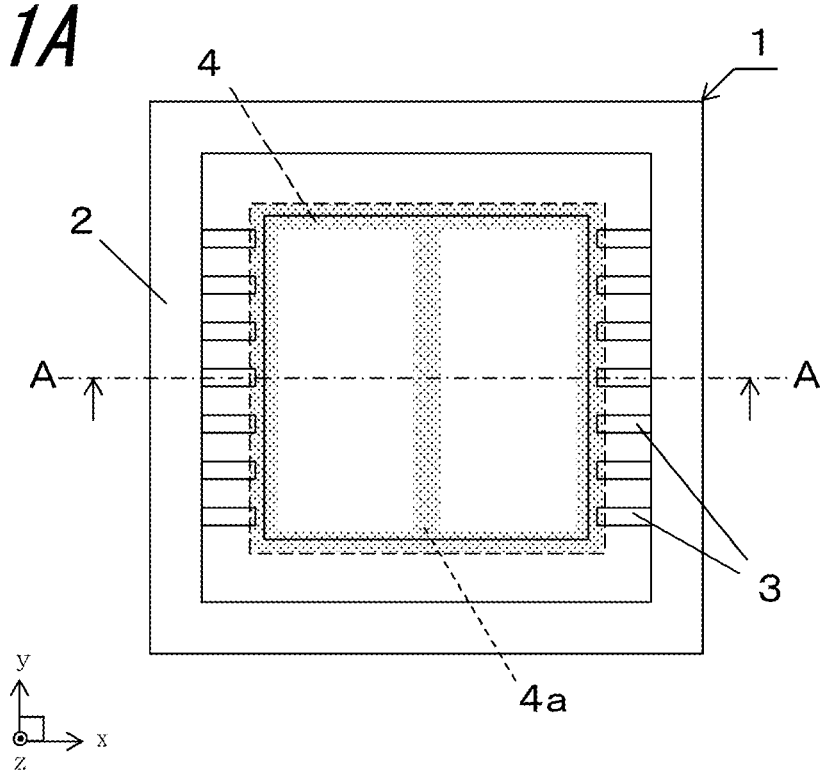
FIG. 1A is a top view of a wiring board according to a first embodiment of the present invention showing its appearance.
Figure 1B:
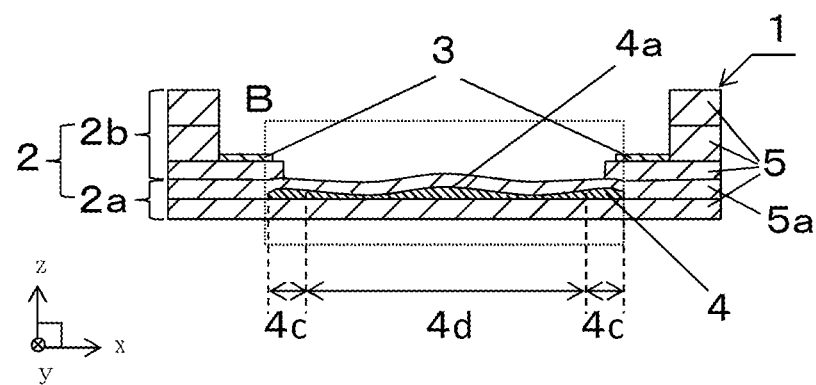
FIG. 1B is a cross-sectional view taken along line A-A in FIG. 1A.
Figure 2A:
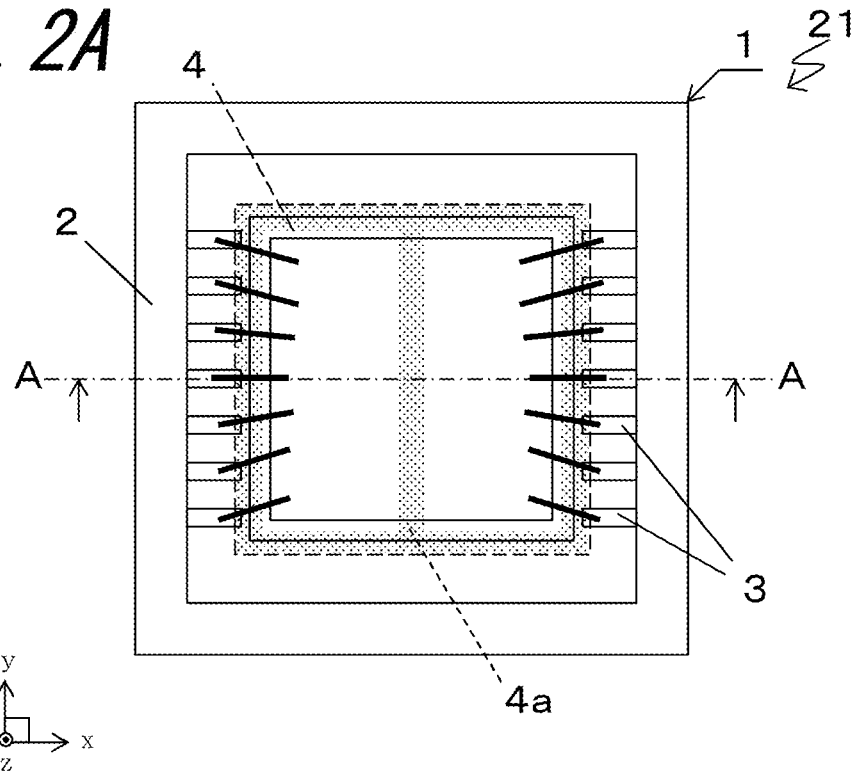
FIG. 2A is a top view of a wiring board and an electronic package according to the first embodiment of the present invention showing their appearance.
Figure 2B:
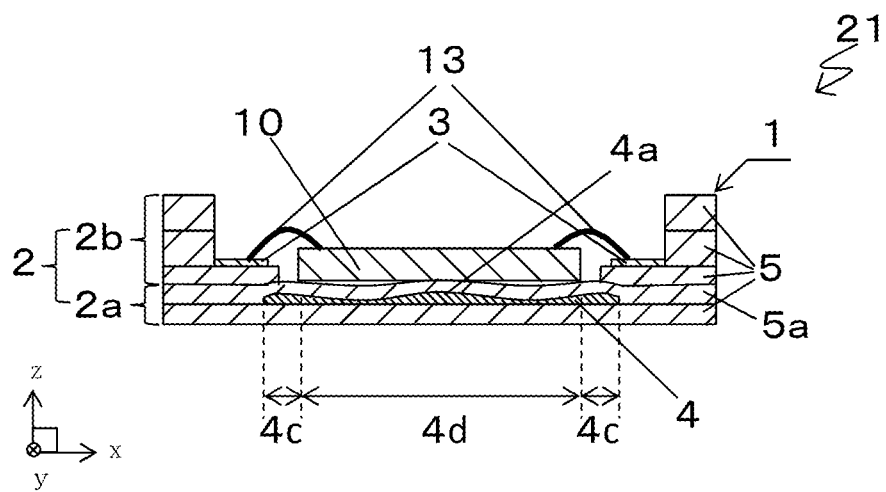
FIG. 2B is a cross-sectional view taken along line A-A in FIG. 2A.
Figure 3A:
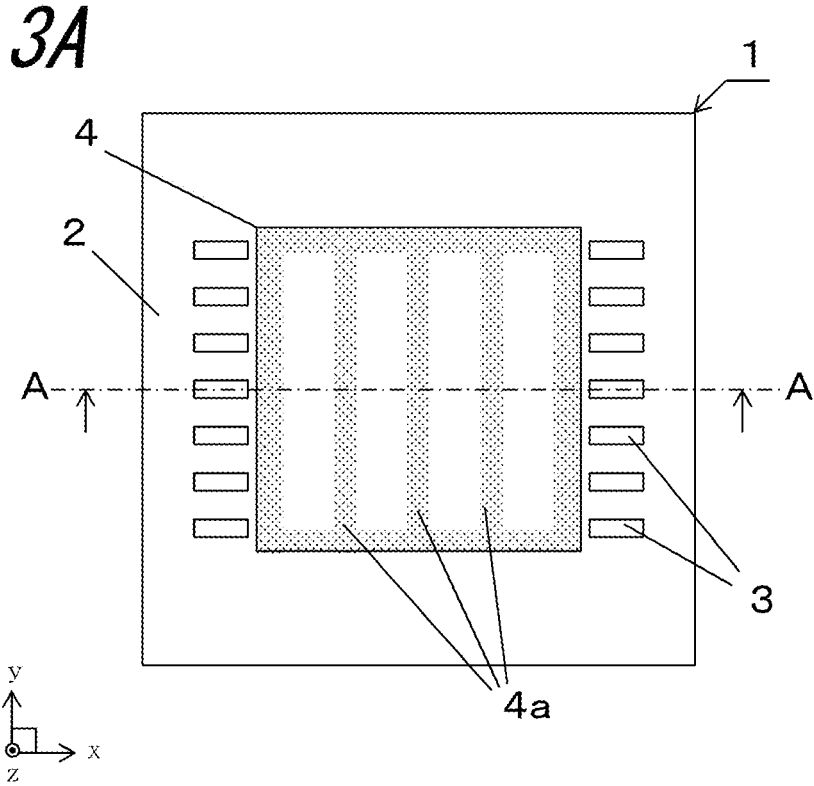
FIG. 3A is a top view of a wiring board according to a modification of the first embodiment of the present invention showing its appearance.
Figure 3B:
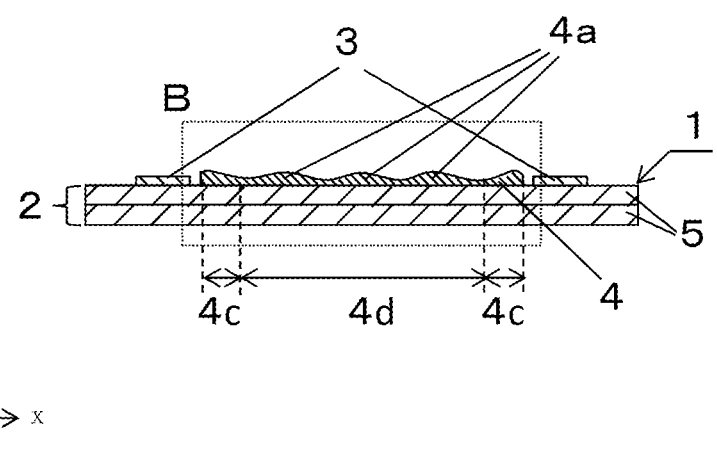
FIG. 3B is a cross-sectional view taken along line A-A in FIG. 3A.
Figure 4A:
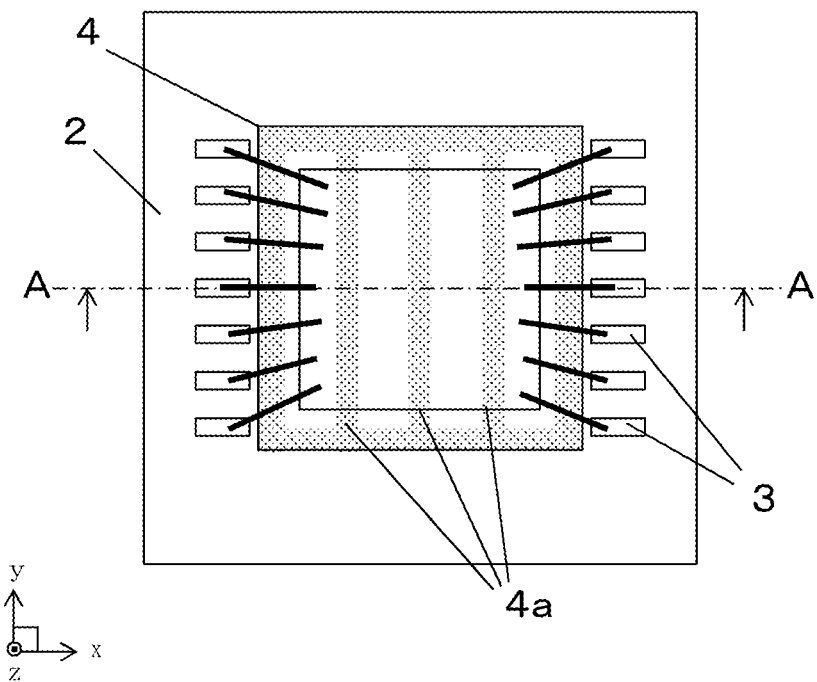
FIG. 4A is a top view of a wiring board and an electronic package according to a modification of the first embodiment of the present invention showing their appearance.
Figure 4B:
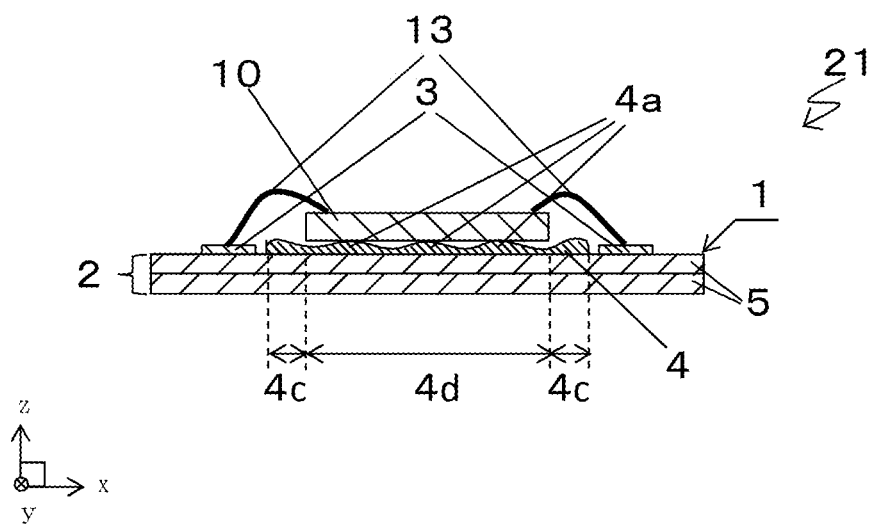
FIG. 4B is a cross-sectional view taken along line A-A in FIG. 4A.

FIG. 5A is an enlarged view of a main part B of the wiring board 1 shown in FIG. 1B, and FIG. 5B is an enlarged view of a main part B of the wiring board 1 shown in FIG. 3B. As in the example shown in FIG. 5A, the insulating layer 5 on the conductive layer 4 may be smoothly corrugated in conformance to the conductive layer 4 in a cross-sectional view. The conductive layer 4 may be smoothly curved in an arc. When stress is applied on the upper surface of the insulating layer 5 in the process for stacking the insulating layers 5 or in the process for mounting the electronic device 10, this structure prevents defects in the conductive layer 4 such as cracks from being caused by stress applied to the rectangular portion between the linear portion 4a and the central portion 4d. The conductive layer 4 can maintain its conductivity in a more reliable manner.

Although the conductive layer 4 and the linear portion 4a are formed toward the upper surface of the wiring board 1 in the examples shown in FIGS. 1A to 5B, the conductive layer 4 may be formed downward toward the lower surface of the wiring board 1. The conductive layer 4 may be exposed downward on the lower surface of the wiring board 1, in the same manner as the conductive layer 4 exposed on the upper surface of the wiring board 1 shown in FIGS. 3A to 4B. The conductive layer 4 exposed on the lower surface of the wiring board 1 in contact with, for example, an external heat dissipating member, can improve the heat dissipation.

The electronic package 21 will now be described with reference to FIGS. 2A and 2B and FIGS. 4A and 4B. In the examples shown in FIGS. 2A and 2B and FIGS. 4A and 4B, the electronic package 21 includes the wiring board 1, and the electronic device 10 mounted on the wiring board 1. The electronic device 10 is mounted to overlap the linear portion 4a.

The electronic device 10 includes, for example, an imaging device such as a charge coupled device (CCD) or a complementary metal oxide semiconductor (CMOS), a light-emitting device such as a light emitting diode (LED), or a semiconductor circuit element. In the examples shown in FIGS. 2A and 2B and FIGS. 4A and 4B, the electrodes of the electronic device 10 are electrically connected to the pads 3 with interconnections 13 (e.g., bonding wires). In the examples shown in FIGS. 2A and 2B and FIGS. 4A and 4B, the electronic device 10 is connected to the wiring board 1 with the interconnections 13 (e.g., bonding wires), which may be gold or solder balls, metal leads formed from, for example, copper (tape automated bonding, or TAB mounting), or anisotropic conductive resins formed from, for example, a resin.

The lower surface of the electronic device 10 and the upper surface of the wiring board 1 are bonded to each other with, for example, a thermosetting resin to firmly mount the electronic device 10 and to reduce positional deviations of the electronic device 10 during, for example, handling. The thermosetting resin used between the lower surface of the electronic device 10 and the mount area of the wiring board 1 on which the electronic device is to be mounted in the process for mounting the electronic device 10 may reduce dust or other matter from being generated from friction between the wiring board 1 and the electronic device 10 in the mounting or other processes.

The electronic package 21 may include a lid on the upper surface of the frame 2b or the substrate 2. The lid may be bonded to the frame 2b or the substrate 2 with a thermosetting resin or a bonding member formed from a metal brazing material. When the electronic device to be mounted on the wiring board 1 is, for example, a semiconductor circuit element or a gyro sensor, the lid may be formed from a material that does not transmit light, such as a metal or a resin.

When the electronic device to be mounted on the wiring board 1 is an imaging device such as a CCD or a CMOS or a light-emitting device such as an LED, the lid is formed from a material that transmits light, such as glass, quartz, or a resin. The lid has a rectangular profile as viewed from above, having a length of 2.5 to 95 mm on its one side, and a height of for example 0.1 to 5 mm.

The electronic package 21 according to the embodiment of the present invention includes the wiring board 1 according to the embodiment of the present invention to improve the mountability of the electronic device 10.

An example method for manufacturing the wiring board 1 according to the present embodiment will now be described.

The manufacturing method described below uses a mother substrate to be cut into multiple wiring boards.

(1) A ceramic green sheet that is to be the insulating layer 5 included in the wiring board 1 is prepared first. For example, to form the insulating layer 5 that is sintered aluminum oxide ($Al_2O_3$), powders, such as silica ($SiO_2$), magnesia (MgO), and calcium oxide (CaO), are added as a sintering aid to $Al_2O_3$ powder, and an appropriate binder, an appropriate solvent, and an appropriate plasticizer are added to the mixture, which is then kneaded to form slurry. The slurry is then shaped into a sheet using a method known in the art, such as a doctor blade or calendaring to obtain a ceramic green sheet for a mother substrate to be cut into multiple wiring boards.

The substrate 2 formed from, for example, a resin, may be formed using a mold for molding into a predetermined shape by transfer molding or injection molding.

The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) The ceramic green sheet resulting from the above process (1) then receives a metal paste applied or filled in the areas to be the pads 3, the conductive layer 4, the electrodes, and inner wiring conductors including feedthrough conductors and inner wires by screen printing or other techniques.

The metal paste is prepared by adding an appropriate solvent and a binder to the metal powder containing the above metal materials and then kneading the mixture to have an appropriate viscosity. The metal paste may contain glass or ceramic to increase the strength of bonding with the wiring board 1.

In this process, the linear portion 4a is formed in the conductive layer 4. The linear portion 4a may be formed with, for example, one of the methods shown in FIGS. 11A to 12B. FIGS. 11A to 12B show an electronic device mounting substrate 41 during manufacture.

Figure 11A:
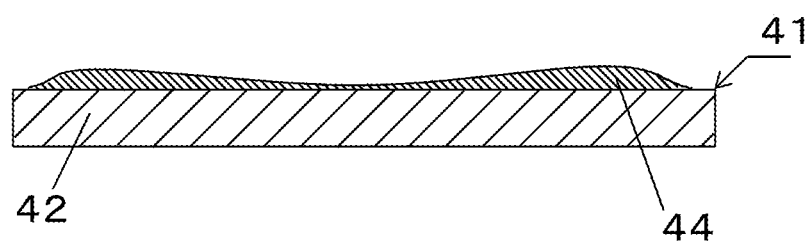
FIGS. 11A and 11B are schematic cross-sectional views of a wiring board according to one or more embodiments of the present invention describing its method of manufacture.
Figure 11B:
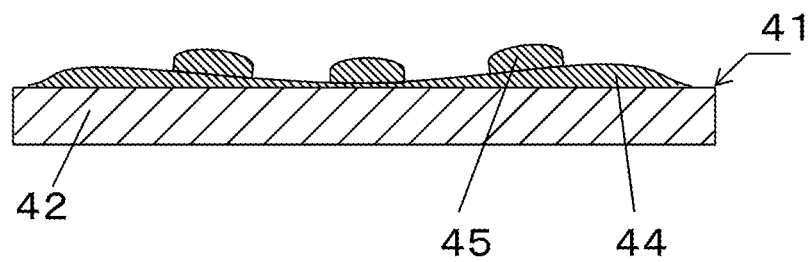

With the manufacturing method shown in FIGS. 11A and 11B, a first conductor ink 44 is first printed on a ceramic green sheet 42 by screen printing. A second conductor ink 45 is then printed by screen printing or another method at an intended position at which the linear portion 4a is to be formed in the central portion 4d of the first conductor ink 44 printed on the ceramic green sheet 42. The first conductor ink 44 and the second conductor ink 45 are pressed from above, or the ceramic green sheet 42 is placed over the first conductor ink 44 and the second conductor ink 45 and then pressed to form the conductive layer 4 including the linear portion 4a.

Figure 12A:
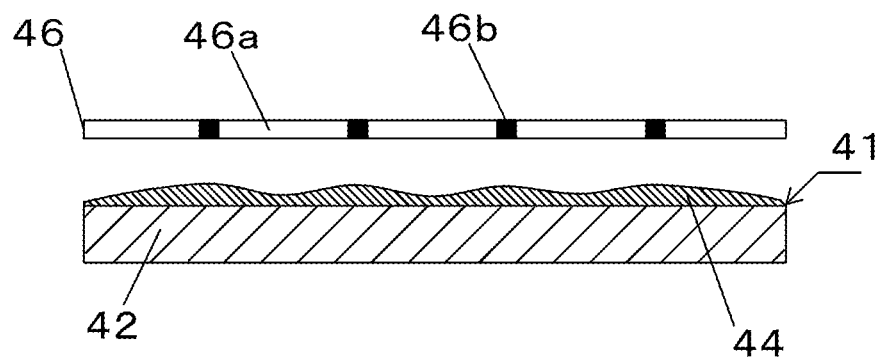
FIGS. 12A and 12B are schematic cross-sectional views of a wiring board according to one or more embodiments of the present invention describing its other method of manufacture.
Figure 12A:
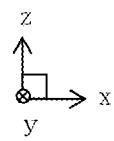
Figure 12B:
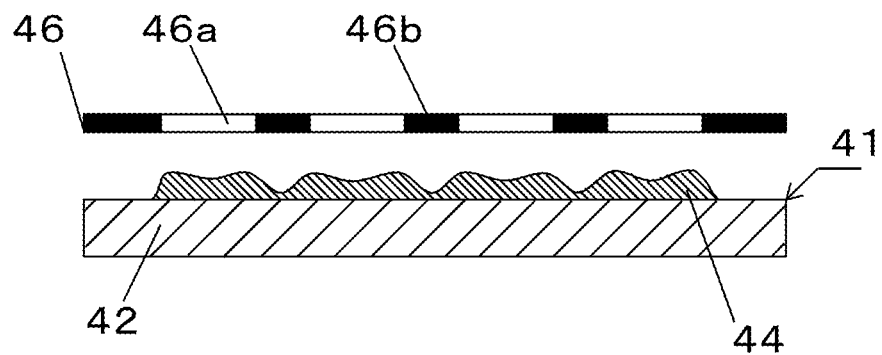
Figure 12B:
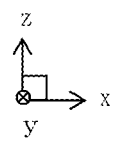

The manufacturing methods shown in FIGS. 12A and 12B will now be described. The methods shown in FIGS. 12A and 12B each use a mask 46 for screen printing. The mask 46 has mask openings 46a and mask closures 46b. The methods shown in FIGS. 12A and 12B differ from each other in that the mask 46 in FIG. 12B has larger mask closures 46b than in FIG. 12A. The manufacturing methods shown in FIGS. 12A and 12B each use the mask having the mask closures 46b with controlled sizes to form the linear portions 4a through a single screen printing process as in the examples shown in FIGS. 12A and 12B. As in the examples shown in FIGS. 12A and 12B, the sizes of the mask closures 46b are controlled to control the height difference of the linear portions 4a.

The manufacturing methods shown in FIGS. 11A to 12B are also usable for the insulating layer 5 formed from, for example, a resin to form the linear portions 4a in the center in the conductive layer 4.

(3) The ceramic green sheet 42 is then processed. The wiring board 1 with a recess may be manufacture by preparing the ceramic green sheet 42 that is to be the frame 2b and the base 2a and then integrating the ceramic green sheet 42 and the base 2a through the process of stacking the frame 2b and the base 2a and pressing them (described later). The ceramic green sheet 42 to be the frame 2b may be prepared by punching a part to be an opening with a mold or by laser processing. In some embodiments, a plurality of ceramic green sheets 42 may be stacked on one another and pressed to form a ceramic green sheet laminate, which is then punched to form an opening.

(4) A ceramic green sheet laminate that is to be the wiring board 1 is then manufactured by stacking and pressing the ceramic green sheets 42 to be the insulating layers. In this process, the ceramic green sheet 42 to be the frame 2b described above, and the ceramic green sheet 42 to be the base 2a are stacked on each other and pressed into a single ceramic green sheet laminate that is to be the wiring board 1.

(5) This ceramic green sheet laminate is then fired at about 1,500 to 1,800° C. to obtain a mother substrate including a plurality of wiring boards 1. In this process, the metal paste described above is fired together with the ceramic green sheet 42 to be the wiring board 1 to form the pads 3, the conductive layer 4, the electrodes, and the inner wiring conductors or the outer wiring conductors.

(6) The mother substrate resulting from the firing process is then cut into a plurality of wiring boards 1. In this cutting process, separation grooves may be formed along the outer edge of each wiring board 1, and the mother substrate may be split along the separation grooves into the plurality of wiring boards 1. In other embodiments, the mother substrate may be cut along the outer edge of each wiring board 1 by, for example, slicing. The separation grooves may have a depth smaller than the thickness of the mother substrate using a slicer after the firing process. In still other embodiments, the separation grooves may be formed by pressing a cutter blade onto the ceramic green sheet laminate that is to be the mother substrate or by cutting the ceramic green sheet laminate to a depth smaller than its thickness with a slicer.

The wiring board 1 is obtained through the processes (1) to (6) described above. The processes (1) to (6) may be performed in any order.

The electronic device 10 is mounted onto the wiring board 1 manufactured in this manner to complete the electronic package 21.

Second Embodiment

Figure 6A:
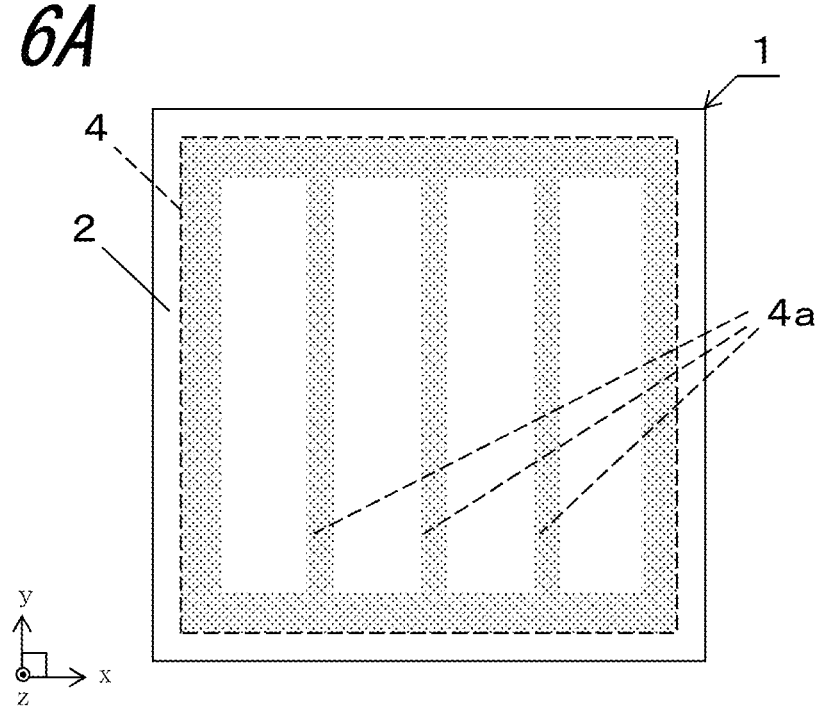
FIGS. 6A and 6B are top views of a wiring board according to a second embodiment of the present invention.

A wiring board 1 according to a second embodiment of the present invention will now be described with reference to FIGS. 6A to 7. In FIGS. 6A to 7, a dotted line indicates an inner layer, and a dotted hatched area indicates a ridge of the conductive layer 4 (a raised portion in a cross-sectional view).

The wiring board 1 according to the present embodiment differs from the wiring board 1 according to the first embodiment in the linear portion 4a as viewed from above. More specifically, the wiring board 1 according to the present embodiment differs from the wiring board 1 according to the first embodiment in including the plurality of linear portions 4a in FIG. 6A, including the linear portions 4a that are rectangular in FIG. 6B, and including the linear portions 4a extending radially outward from the center of the insulating layer 5 in FIG. 7.

The wiring board 1 in FIG. 6A includes an electronic device mount on which the electronic device 10 is to be mounted, and the linear portion 4a includes at least two linear portions included in the electronic device mount. The at least two linear portions 4a are spaced from one another.

In the example shown in FIG. 6A, the wiring board 1 includes at least two linear portions 4a spaced from each other in the electronic device mount on which the electronic device 10 is to be mounted. This structure can further reduce the width of the recess on the conductive layer 4. This structure reduces deformation of the insulating layer 5 caused by the height difference between the peripheral portion 4c and the central portion 4d in the conductive layer 4, and may improve the flatness of the electronic device mount.

As in the example shown in FIG. 6A, the electronic device mount includes the linear portions 4a that are spaced from each other. These linear portions 4a support the periphery of the electronic device 10 to be mounted to overlap the conductive layer 4, and thus prevents the electronic device 10 from tilting during the mounting process, and allows stable mounting. This may further improve the mountability of the electronic device 10 onto the wiring board 1 in the mounting process.

Figure 6B:
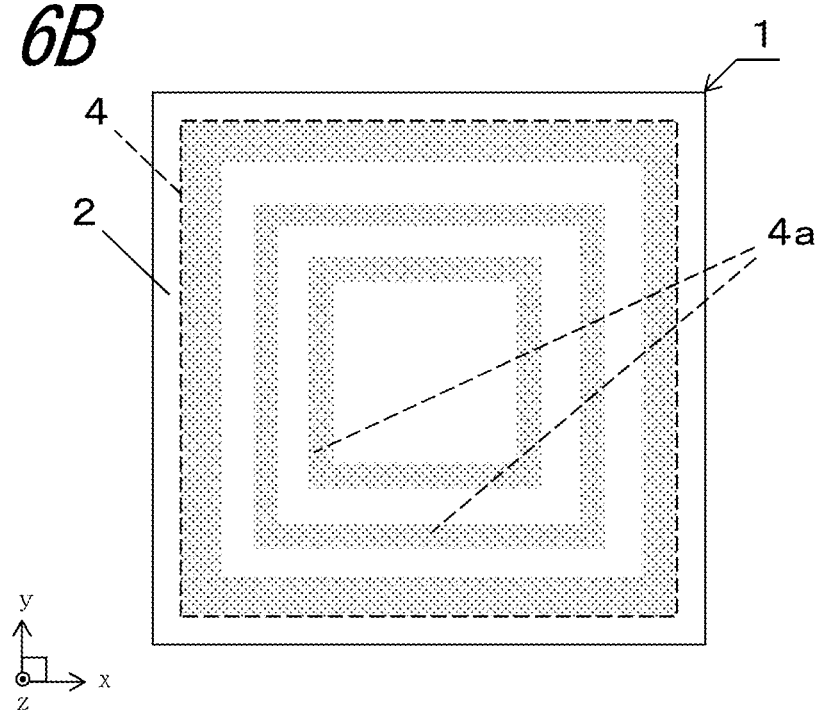
Figure 7:
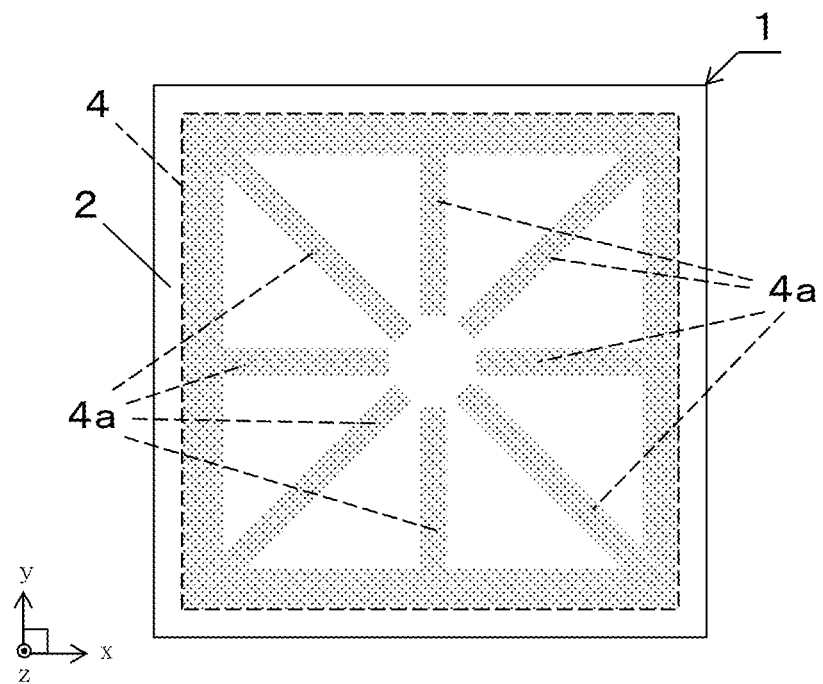
FIG. 7 is a top view of a wiring board according to a modification of the second embodiment of the present invention.

The wiring board 1 shown in FIG. 6B is rectangular, and includes the linear portions 4a along each of the four sides of the wiring board 1 and the linear portions 4a are continuous frames having four sides along the four sides of the wiring board as viewed from above.

Typically, the peripheral portion 4c in the conductive layer 4 may be formed across the entire periphery of the conductive layer 4. The linear portions 4a that are frames as in the example shown in FIG. 6B can reduce the width of the recess on the conductive layer 4 in both X and Y directions in the wiring board 1. This improves the flatness of the wiring board 1, and further improves the mountability of the electronic device 10 onto the wiring board 1 in the mounting process.

In the wiring board 1 shown in FIG. 7, the linear portions 4a extend radially outward from the center of the wiring board 1.

The linear portions 4a extending radially outward from the center of the wiring board 1 as in the example shown in FIG. 7 reduce the width of the recess on the conductive layer 4 in both X and Y directions in the wiring board 1, as in the example shown in FIG. 6B. This improves the flatness of the wiring board 1, and further improves the mountability of the electronic device 10 onto the wiring board 1 in the mounting process.

The linear portions 4a may be arranged near one another at the center of the wiring board 1. This improves the flatness at the center of the wiring board 1, and further improves the mountability of the electronic device 10 onto the wiring board 1 in the mounting process.

The linear portions 4a extending radially outward from the center of the wiring board 1 allow heat from the electronic device 10 mounted on, for example, the center of the wiring board 10 to be efficiently dissipated during operation of the electronic device 10. The structure including the linear portions 4a extending from the center on diagonal lines as in the example shown in FIG. 7 may use a bond of, for example, a resin on the lower surface of the electronic device 10. The resultant self-alignment effect thus allows the electronic device 10 to be easily mounted at the center of the linear portions 4a. The bond formed from, for example, a resin may be easily spread along the linear portions 4a.

Although the conductive layer 4 is formed between the insulating layer 5 and the second insulating layer 5a in the examples shown in FIGS. 6A to 7, the conductive layer 4 may be formed on the upper or lower surface of the wiring board 1.

When the substrate 2 is formed from an electrical insulating ceramic material, the linear portions 4a shown in FIGS. 6A to 7 may be formed by, for example, screen printing. A conductor ink to be the linear portion 4a is applied by screen printing using a mask intended for an appropriate shape.

Third Embodiment

Figure 8A:
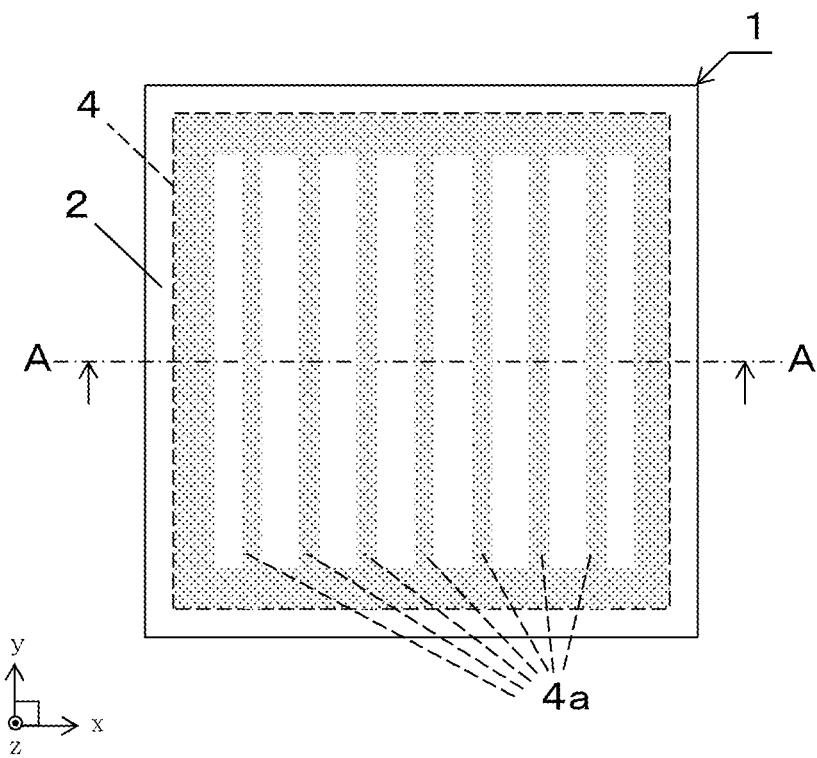
FIG. 8A is a top view of a wiring board according to a third embodiment of the present invention showing its appearance.
Figure 8B:
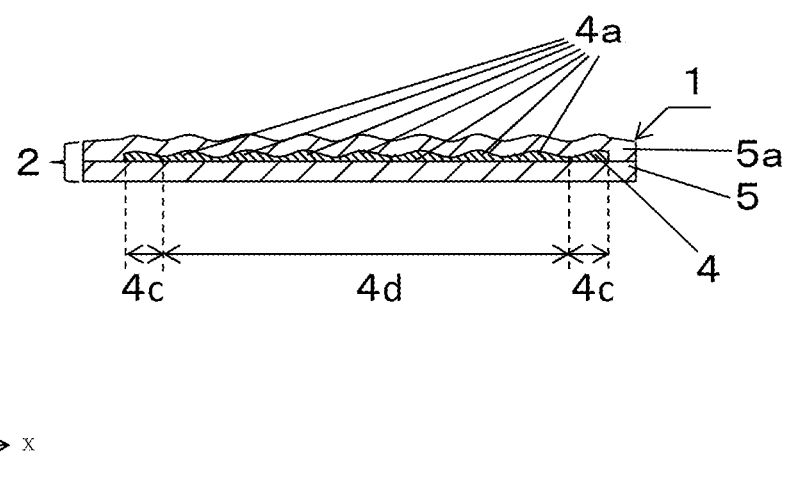
FIG. 8B is a cross-sectional view taken along line A-A in FIG. 8A.

A wiring board 1 according to a third embodiment of the present invention will now be described with reference to FIGS. 8A and 8B. In FIGS. 8A and 8B, a dotted line indicates an inner layer, and a dotted hatched area indicates a ridge of the conductive layer 4 (a raised portion in a cross-sectional view).

The wiring board 1 according to the present embodiment differs from the wiring board 1 according to the first embodiment in including more linear portions 4a.

As in the example shown in FIGS. 8A and 8B, more linear portions 4a are arranged at shorter intervals to further reduce the width of the recess on the conductive layer 4. This structure further improves the mountability of the electronic device 10.

The linear portions 4a are arranged at intervals of 30% of or less of the length in the longitudinal or lateral direction of the electronic device 10 mounted on the wiring board 1. This prevents the electronic device 10 from tilting due to the shape of the conductive layer 4. The linear portions 4a are arranged at shorter intervals to allow variously sized electronic devices 10 to be mountable.

Although the conductive layer 4 is formed between the insulating layer 5 and the second insulating layer 5a in the example shown in FIGS. 8A and 8B, the conductive layer 4 may be formed on the upper or lower surface of the wiring board 1.

Fourth Embodiment

Figure 9:
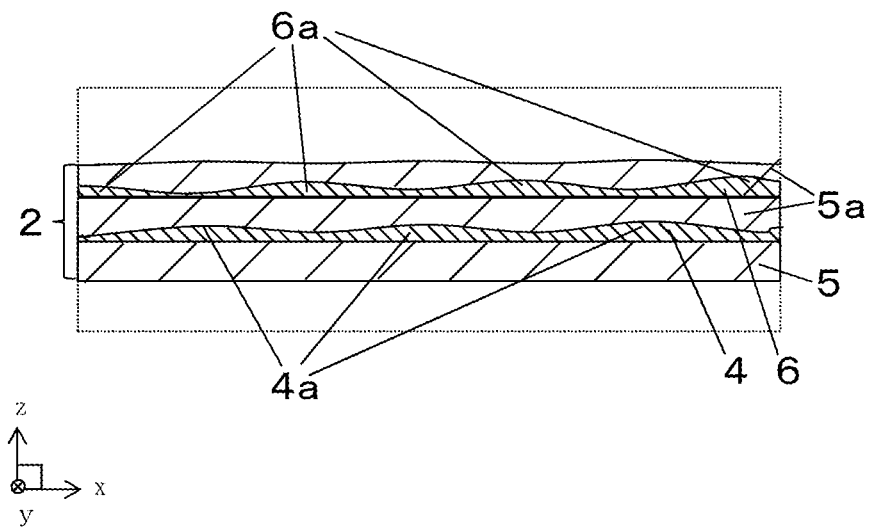
FIG. 9 is an enlarged view of a main part B of a wiring board according to a fourth embodiment of the present invention.

A wiring board 1 according to a fourth embodiment of the present invention will now be described with reference to FIG. 9. FIG. 9 is an enlarged view of a main part of the present embodiment, which is the central portion 4d, and does not show the peripheral portion 4c.

The wiring board 1 according to the present embodiment differs from the wiring board 1 according to the first embodiment in including two conductive layers 4.

In the wiring board 1 according to the present embodiment, a second conductive layer 6 that is raised upward is formed on the second insulating layer 5a. The second conductive layer is located to avoid overlapping the highest part of the peripheral portion 4c and the highest parts of the linear portions 4a of the conductive layer 4.

In the example shown in FIG. 9, the wiring board 1 includes a plurality of conductive layers 4, and the linear portions 4a formed on each conductive layer 4 to avoid overlapping the linear portions 4a as viewed from above. This may further improve the flatness of the wiring board 1, and may further reduce deformation of the wiring board 1 to form a recess on its surface by forming second linear portions 6a on the second conductive layer 6 to overlap recesses that remain although the linear portions 4a are formed on the conductive layer 4.

Typically, the conductive layer 4 connected to the power supply and the conductive layer 4 connected to the ground may preferably overlap each other as viewed from above. When each of the conductive layers 4 includes the peripheral portion 4c and the central portion 4d overlapping each other as viewed above, the second insulating layer 5a to be formed on the peripheral portion 4c and the central portion 4d may deform greater. In response to this, the linear portions 4a are formed on the conductive layer 4 to avoid overlapping the second linear portions 6a on the second conductive layer 6 as viewed from above, like the present embodiment. For the conductive layer 4 connected to the power supply and the conductive layer 4 connected to the ground overlapping each other, the insulating layer 5 to be formed on each of these layers may deform less. This improves the electrical characteristics while reducing deformation of the wiring board 1.

When the substrate 2 is formed from an electrical insulating ceramic material, the wiring board 1 as in the example shown in FIG. 9 may be manufactured by, for example, forming the conductive layers 4. A conductor ink is then applied by screen printing using a mask for forming the linear portions 4a and the second linear portions 6a that avoid overlapping each other.

Fifth Embodiment

Figure 10:
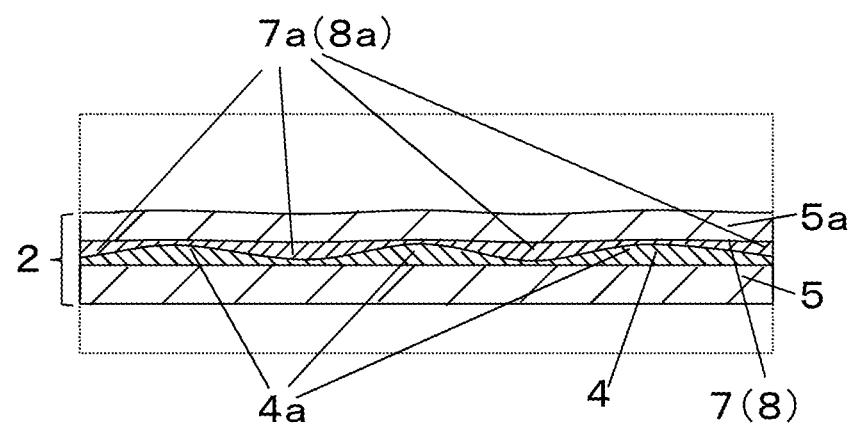
FIG. 10 is an enlarged view of a main part B of a wiring board according to a fifth embodiment of the present invention.

A wiring board 1 according to a fifth embodiment of the present embodiment will now be described with reference to FIG. 10. FIG. 10 is an enlarged view of a main part of the present embodiment, which is the central portion 4d, and does not show the peripheral portion 4c. The wiring board 1 according to the present embodiment differs from the wiring board 1 according to the fourth embodiment in including two conductive layers 4 facing each other.

The wiring board 1 according to the present embodiment includes a third conductive layer 7 recessed upward on the conductive layer 4. The third conductive layer is located to overlap the highest part of the peripheral portion 4c and the highest parts of the linear portions 4a of the conductive layer 4.

In the example shown in FIG. 10, deformation of the wiring board 1 to form a recess on its surface is further reduced by forming third linear portions 7a in the third conductive layer 7 to overlap the recesses that are not completely eliminated by forming the linear portions 4a on the conductive layer 4. This may improve the mountability of the electronic device 10.

As in the example shown in FIG. 10, the third conductive layer 7 in contact with the conductive layer 4 is formed on the lower surface of the second insulating layer 5a to increase the thickness of the conductive layer 4. When, for example, the conductive layer 4 is connected to a power supply or the ground, the conductive layer 4 can have a lower resistance. The structure according to the present embodiment thus improves the electrical characteristics while reducing deformation of the wiring board 1 to form a recess on its surface.

In the present embodiment, a smoothing film 8 recessed upward on the conductive layer may be formed on the conductive layer 4. The smoothing film is located to overlap the highest part of the peripheral portion 4c and the highest parts of the linear portions 4a of the conductive layer 4. The structure herein differs from the structure shown in FIG. 10 in including the smoothing film 8 with electrical insulating properties in contact with the conductive layer 4. This may further reduce deformation of the wiring board 1 to form a recess as in the example shown in FIG. 10. This may further reduce deformation of the wiring board 1 to form a recess, and may further improve the mountability of the electronic device 10. The smoothing film 8 is an insulator and may be formed mainly from the same material as the material for the insulating layer 5. Part of the smoothing film 8 serves as smoothing film linear portions 8a.

When the substrate 2 is formed from an electrical insulating ceramic material, the wiring board 1 as in the example shown in FIG. 10 may be manufactured by screen printing on the lower surface of the second insulating layer 5a. A conductive ink or an insulating paste is applied by screen printing, and a raised portion is formed with the manufacturing method shown in FIGS. 11A and 11B or FIGS. 12A and 12B to complete the wiring board 1.

The present invention is not limited to the examples described in the above embodiments, and include variously modifying numerical values. Also, although the shape of the pads 3, the conductive layer 4, or the linear portion 4a is rectangular in the examples shown in FIGS. 1A to 4B, their shape may be circular or other polygons.

The arrangement, the number, and the shape of the pads 3 and the conductive layers 4 are not limited. Various combinations of the features are not limited to the examples described in the above embodiments.

REFERENCE SIGNS LIST 1 wiring board
2 substance
2a substrate
2b frame
3 pad
4 conductive layer
4a linear portion
4c peripheral portion
4d central portion
5 insulating layer
5a second insulating layer
6 second conductive layer
6a second linear portion
7 third conductive layer
7a third linear portion
8 smoothing film
8a smoothing film linear portion
10 electronic device
13 interconnection
21 electronic package
41 electronic device mounting substrate during manufacture
42 ceramic green sheet
44 first conductor ink
45 second conductor ink
46 mask
46a mask opening
46b mask closure

The invention claimed is:

1. A wiring board, comprising:
a first insulating layer comprising an upper surface that comprises an outer edge;
a first conductive layer on the upper surface of the first insulating layer, separated from the outer edge, including:
a peripheral portion having a first thickness; and
a central portion being further away from the outer edge of the first insulating layer than the peripheral portion is to the outer edge of the first insulating layer, and having a second thickness smaller than the first thickness, and comprising a first linear portion having a third thickness larger than the second thickness,
a second insulating layer on an upper surface of the first conductive layer, the second insulating layer covering the first conductive layer; and
a second conductive layer disposed on the second insulating layer protruding upward from the second insulating layer, not overlapping a thickest part of the peripheral portion and a thickest part of the first linear portion of the first conductive layer.

2. The wiring board according to claim 1, further comprising:
an electronic device mount on which an electronic device is mountable.

3. An electronic package, comprising:
the wiring board according to claim 2, and
an electronic device mounted on an upper surface of the wiring board, the electronic device overlapping the first linear portion in a plan view.

4. The electronic package according to claim 2, further comprising:
a second linear portion located in the electronic device mount, and spaced from the first linear portion.

5. The wiring board according to claim 1, wherein
the wiring board has a rectangular shape, and
the first linear portion has a frame shape.

6. The wiring board according to claim 1, wherein
the first linear portion is on a line that extends radially outward from the center.

7. The wiring board according to claim 1, wherein
the first conductive layer is on a surface of the wiring board.

8. A wiring board, comprising:
a first insulating layer comprising an upper surface that comprises an outer edge;
a first conductive layer on the upper surface of the first insulating layer, separated from the outer edge, including:
a peripheral portion having a first thickness; and
a central portion being further away from the outer edge of the first insulating layer than the peripheral portion is to the outer edge of the first insulating layer, and having a second thickness smaller than the first thickness, and
comprising a first linear portion having a third thickness larger than the second thickness, and
wherein the first conductive layer is integrated with the wiring board in a sintered state;
a second insulating layer on an upper surface of the first conductive layer, the second insulating layer covering the first conductive layer; and
a second conductive layer disposed on the second insulating layer protruding upward from the second insulating layer, not overlapping a thickest part of the peripheral portion and a thickest part of the first linear portion of the first conductive layer.

* * * * *